United States Patent
Huang et al.

(10) Patent No.: US 10,249,772 B2
(45) Date of Patent: Apr. 2, 2019

(54) SOLAR CELL

(71) Applicant: Industrial Technology Research Institute, Hsinchu (TW)

(72) Inventors: Lee-May Huang, Tainan (TW); Wen-Bin Bai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 59 days.

(21) Appl. No.: 15/368,705

(22) Filed: Dec. 5, 2016

(65) Prior Publication Data

US 2017/0186892 A1 Jun. 29, 2017

Related U.S. Application Data

(60) Provisional application No. 62/271,332, filed on Dec. 28, 2015.

(30) Foreign Application Priority Data

Dec. 28, 2015 (TW) .............................. 104144015 A

(51) Int. Cl.
*H01L 31/0216* (2014.01)
*H01L 31/0224* (2006.01)
*H01L 31/0749* (2012.01)

(52) U.S. Cl.
CPC .................. *H01L 31/02167* (2013.01); *H01L 31/022425* (2013.01); *H01L 31/022433* (2013.01);
(Continued)

(58) Field of Classification Search
CPC ....... H01L 31/02167; H01L 31/022433; H01L 31/022475; H01L 31/022483; H01L 31/0749
(Continued)

(56) References Cited

U.S. PATENT DOCUMENTS 5,571,392 A 11/1996 Sato et al.
6,734,037 B1 5/2004 Fath et al.
(Continued)

FOREIGN PATENT DOCUMENTS

| CN | 1639880 | 7/2005 |
| CN | 103633157 | 3/2014 |

(Continued)

OTHER PUBLICATIONS

Kim et al., Control of the electrode work function and active layer morphology via surface modification of indium tin oxide for high efficiency organic photovoltaics, Applied Physical Letters, vol./Issue 91, pp. 112111-1 through 112111-3 (Year: 2007).*
(Continued)

*Primary Examiner* — Jayne L Mershon
(74) *Attorney, Agent, or Firm* — JCIPRNET

(57) ABSTRACT

A solar cell having an electrical modulating stack layer is provided. The solar cell includes a first electrode, a second electrode, a photoelectric conversion layer, disposed between the first electrode and the second electrode. A first electrical modulating stack layer is disposed on the first electrode, wherein the first electrical modulating stack layer includes at least one positively charged layer and at least one negatively charged layer or the first electrical modulating layer includes a first surface modification layer.

19 Claims, 7 Drawing Sheets

(52) U.S. Cl.
CPC ............... H01L 31/022475 (2013.01); H01L 31/022483 (2013.01); H01L 31/0749 (2013.01); *Y02E 10/541* (2013.01); *Y02P 70/521* (2015.11)

(58) Field of Classification Search
USPC ........................................................ 136/256
See application file for complete search history.

(56) References Cited

U.S. PATENT DOCUMENTS

| | | | |
|---|---|---|---|
| 7,659,475 | B2 | 2/2010 | Agostinelli et al. |
| 7,993,700 | B2 | 8/2011 | Zhou et al. |
| 8,062,964 | B2 | 11/2011 | Tsai et al. |
| 8,168,462 | B2 | 5/2012 | Borden et al. |
| 8,696,945 | B2 | 4/2014 | Wu et al. |
| 2005/0109389 | A1 | 5/2005 | Middelman et al. |
| 2009/0211623 | A1 | 8/2009 | Meier et al. |
| 2010/0132774 | A1 | 6/2010 | Borden |
| 2011/0048515 | A1 | 3/2011 | Englert et al. |
| 2011/0284064 | A1 | 11/2011 | Engelhart et al. |
| 2014/0053889 | A1* | 2/2014 | Huang ............... H01L 31/046 136/244 |
| 2014/0174529 | A1 | 6/2014 | Wu et al. |

FOREIGN PATENT DOCUMENTS

| | | |
|---|---|---|
| TW | 201201222 | 1/2012 |
| TW | 201403850 | 1/2014 |
| TW | 201417318 | 5/2014 |
| TW | 201417319 | 5/2014 |
| TW | 201431106 | 8/2014 |

OTHER PUBLICATIONS

K.A. Munzer et al., "Physical properties of industrial 19% rear side passivated AI-LBSFR-solar cells", Energy Procedia, Apr. 17-20, 2011, pp. 1-6.

Bart Vermang et al., "Improved Rear Surface Passivation of Cu (In,Ga)Se2 Solar Cells: A Combination of an Al2O3 Rear Surface Passivation Layer and Nanosized Local Rear Point Contacts", IEEE Journal of Photovoltaics, Jan. 2014, pp. 1-7.

S.Schwarz et al., "Polyelectrolyte adsorption on charged surfaces: study by electrokinetic measurements", Colloids and Surfaces A: Physicochemical and Engineering Aspects, Sep. 30, 1998, pp. 1-8.

B. Hoex et al., "On the c-Si surface passivation mechanism by the negative-charge-dielectric Al2O3", Journal of Applied Physics, Dec. 1, 2008, pp. 1-8.

"Office Action of Taiwan Counterpart Application", dated Jun. 27, 2016, p. 1-p. 8.

"Office Action of Taiwan Counterpart Application", dated Oct. 27, 2016, p. 1-p. 6.

"Office Action of China Counterpart Application", dated Feb. 27, 2018, p. 1-p. 28.

* cited by examiner

SOLAR CELL

CROSS-REFERENCE TO RELATED APPLICATION

This application claims the priority benefits of U.S. provisional application Ser. No. 62/271,332, filed on Dec. 28, 2015 and Taiwan application serial no. 104144015, filed on Dec. 28, 2015. The entirety of each of the above-mentioned patent applications is hereby incorporated by reference herein and made a part of this specification.

TECHNICAL FIELD

The technical field relates to a solar cell having an electrical modulating stack layer.

BACKGROUND

The theoretical efficiency of a solar cell is high, but the actual power generation efficiency is not the case. There are many factors affecting the cell efficiency, such as series and parallel resistances of the solar cell itself, the shielding of sunlight by the solar cell electrodes, or the loss caused by not effectively capturing the reflected light, etc.

The recombination of electrons and holes inside solar cell is another important factor affecting the cell efficiency. The surface or interface of the semiconductor material of solar cell will produce more lattice defect density, such as dangling bonds. The dangling bonds act as defect traps and therefore are sites of recombination of electron-hole pairs.

Passivation is a commonly used method to minimize the electron-hole pairs recombination at the surface of a solar cell. The two well-known surface passivation methods are chemical passivation and field-effect passivation.

The chemical passivation includes depositing a dielectric material on the surface of a n-type or p-type semiconductor with a thermal oxidation process. The thermal oxidation process provides a good interface passivation quality through chemical bonding between the dielectric layer and the semiconductor, and results in defect density reduction at the interface of the semiconductor/dielectric layer, thereby lowering the recombination probability of the electrons and holes on a semiconductor surface.

The field-effect passivation approach adopts dielectric material to inhibit the recombination of minority carriers. The surface passivation behavior of a dielectric layer depends crucially on the fixed charges polarity in the dielectric layer and the doping concentration of the semiconductor. For example, for n-type semiconductor, silicon nitride having positive charges induces majority carriers (electrons) accumulation at the dielectric/semiconductor interface, causing the energy bands to bend downward. The minority carriers (holes) are shielded from the crystalline silicon solar cell surface.

From the view of structure, the passivation layer formed by both the chemical passivation and the field-effect passivation methods directly contacts the semiconductor photoelectric conversion layer of a solar cell.

SUMMARY

One embodiment of the disclosure provides a solar cell. The solar cell includes a first electrode, a second electrode, a photoelectric conversion layer and a first electrical modulating stack layer. The photoelectric conversion layer disposed between the first electrode and the second electrode. The first electrical modulating stack layer disposed on the first electrode. The first electrical modulating stack layer includes at least one positive charged layer and at least one negative charged layer. The first electrode is disposed between the first electrical modulating stack layer and the photoelectric conversion layer.

One embodiment of the disclosure provides a solar cell. The solar cell includes a first electrode, a second electrode, a photoelectric conversion layer and a first electric electrical modulating stack layer directly disposed on the first electrode. The photoelectric conversion layer disposed between the first electrode and the second electrode. The first electrical modulating stack layer includes a surface modification layer. The first electrode is disposed between the first electrical modulating stack layer and the photoelectric conversion layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
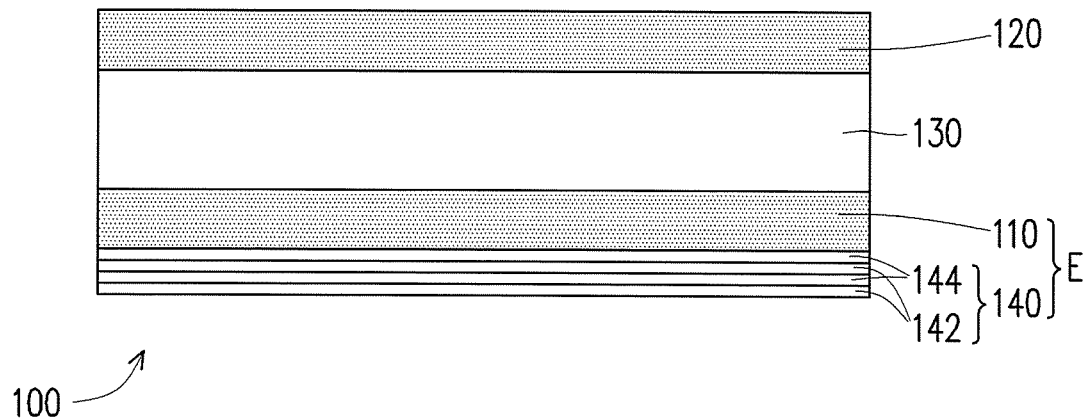
FIGS. 1A and 1B are a cross-sectional diagram illustrating a solar cell according to a first embodiment.
Figure 1B:
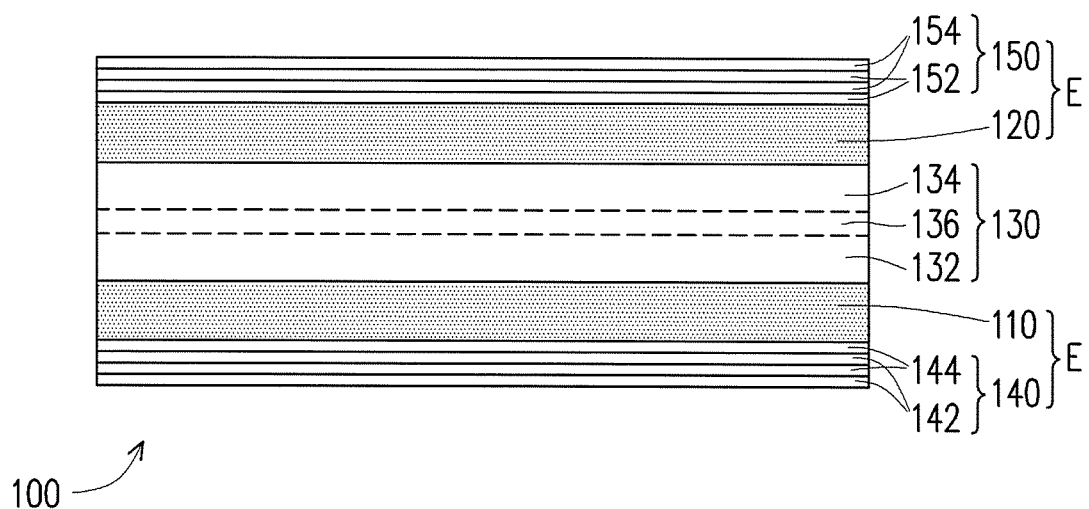

FIGS. 1A and 1B are a cross-sectional diagram illustrating a solar cell according to a first embodiment.

In FIG. 1A, the solar cell 100 includes a first electrode 110, a second electrode 120, a photoelectric conversion layer 130 disposed between the first electrode 110 and the second electrode 120, a first electrical modulating stack layer 140 disposed on the first electrode 110. The first electrical modulating stack layer 140 includes at least one positive charged layer (144 or 142) and at least one negative charged layer (142 or 144). For example, the first electrical modulating stack layer includes at least one positive charged layer 142 and at least one negative charged layer 144 stacked alternately. The first electrode 110 is disposed between the first electrical modulating stack layer 140 and the photoelectric conversion layer 130. In one enbodiment, the first electrode and the first electrical modulating stack layer directly contact each other.

FIG. 1B, the solar cell 100, further including a second electrical modulating stack layer 150 disposed on the second electrode 120. The second electrical modulating stack layer 150 includes at least one positive charged layer (152 or 154) and at least one negative charged layer (154 or 152). For example, the second electrical modulating stack layer includes at least one positive charged layer 152 and at least one negative charged layer 154 stacked alternately. The second electrode 120 is disposed between the second electrical modulating stack layer 150 and the photoelectric conversion layer 130. In one enbodiment, the second electrode and the second electrical modulating stack layer directly contact each other.

Referring to FIGS. 1A and 1B, the first electrical modulating stack layer 140 disposed on the first electrode 110 may be a cathode structure (E) of the solar cell 100, and the second electrical modulating stack layer 150 disposed on the second electrode 120 may be an anode structure (E) of the solar cell, and vice versa. The photoelectric conversion layer 130 is disposed between the cathode structure and the anode structure. However, the first and the second electrical modulating stack layers disposed on each side of the electrode should not contact each other. Unexpected connection to both the cathode structure and anode structure will result in short circuit to the solar cell. In one embodiment, referring to FIG. 1B, the photoelectric conversion layer 130 may include a semiconductor base region 132, a semiconductor emitter region 134, and a depletion region 136 disposed between the semiconductor base region 132 and the semiconductor emitter region 134. The base region 132 disposed between the depletion region 136 and the first electrode 110, and the emitter region 134 disposed between the depletion region 136 and the second electrode 120. The positive charged layer or the negative charged layer of the first electrical modulating stack layer 140 can be a single-layer or a multi-layer structure. Referring to FIG. 1B, for example, the semiconductor base region 132 may be a p-type semiconductor layer and thus, the negative charged layer 144 of the first electrical modulating stack layer is directly disposed on the first electrode. The material of the positive charged layer comprises poly dimethyl diallyl ammonium chloride, poly(allylamine hydrochloride), Polyethylenimine, and the material of the negative charged layer comprises poly(sodium-p-styrenesulfonate), poly(acrylic acid) or poly(perfluorosulfonic acid).

Similarly, the positive charged layer or the negative charged layer of the second electrical modulating stack layer can be a single-layer or a multi-layer structure. Referring to FIG. 1B, the second electrical modulating stack layer 150 includes at least one positive charged layer 152 and one negative charged layer 154 stacked alternately. In one embodiment, the semiconductor emitter region 134 may be a n-type semiconductor layer and thus, and the positive charged layer 152 of the second electrical modulating stack layer 150 directly disposed on the second electrode. The material of the positive charged layer comprises poly dimethyl diallyl ammonium chloride, poly(allylamine hydrochloride), Polyethylenimine, and the material of the negative charged layer comprises poly(sodium-p-styrenesulfonate), poly(acrylic acid) or poly(perfluorosulfonic acid).

In one enbodiment, referring to FIG. 1A or 1B, the first electrode comprises a transparent conductive oxide, a metal layer, or a laminate layer having transparent conductive layer and metal layer, and the second electrode comprises transparent conductive oxide or metal grid electrode, and vice versa. The material of the transparent conductive oxide is ITO or ZnO.

In one embodiment, the solar cell of the disclosure comprises crystalline silicon solar cell, amorphous silicon thin film solar cell, amorphous and microcrystalline silicon thin film solar cell, copper indium gallium selenide (CIGS) or cadmium telluride (CdTe) thin film solar cell.

Figure 2A:
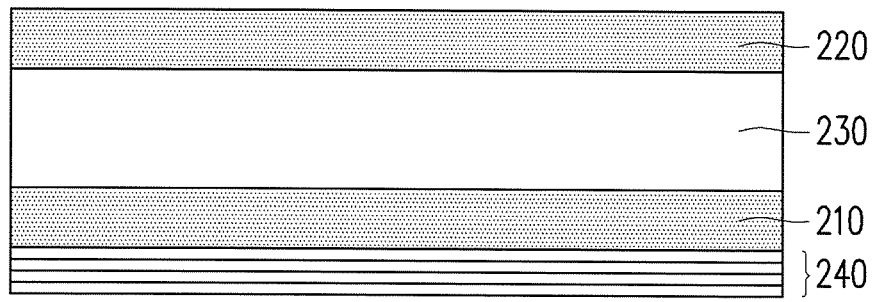
FIGS. 2A and 2B are a cross-sectional diagram illustrating a solar cell according to a second embodiment.
Figure 2B:
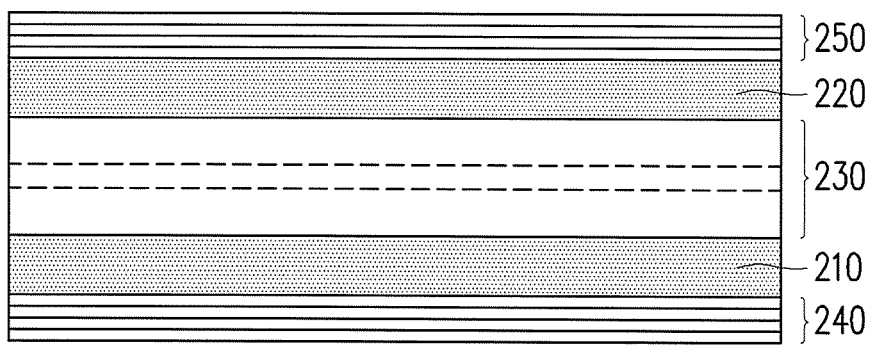

FIG. 2A, 2B are a cross-sectional diagram illustrating a solar cell according to a second embodiment.

In FIG. 2A, the solar cell 200 includes a first electrode 210, a second electrode 220, a photoelectric conversion layer 230 disposed between the first electrode 210 and the second electrode 220, a first electrical modulating stack layer 240 directly disposed on the first electrode 210. The first stack layer includes a surface modification layer. The first electrode 210 is disposed between the second electrical modulating stack layer 240 and the photoelectric conversion layer 230.

FIG. 2B, the solar cell 200, further including a second electrical modulating stack layer 250 directly disposed on the second electrode 220. The second electrical modulating stack layer includes a surface modification layer. The second electrode 220 is disposed between the second electrical modulating stack layer 250 and the photoelectric conversion layer 230.

In one embodiment, the material of the surface modification layer comprises (3-Aminopropyl)trimethoxysilane, (3-Aminopropyl)triethoxysilane, (3-Mercaptopropyl)trimethoxysilane, (3-Glycidyloxypropyl)trimethoxysilane, hydroquinone or alkanethiol.

In one embodiment, the second surface modification layer can be a single-layer or a multi-layer structure.

In one embodiment, the material of the surface modification layer of the first electrical modulating stack layer and the material of the surface modification layer of the second electrical modulating stack may be the same or different.

Referring to FIG. 2B, the first surface modification layer 240 and the second surface modification layer 250 deposited on both sides of the electrode should not contact each other. Unexpected connection to both the cathode and anode will result in short circuit to solar cell.

In one embodiment, the solar cell of the disclosure comprises crystalline silicon solar cell, amorphous silicon thin film solar cell, amorphous and microcrystalline silicon thin film solar cell, copper indium gallium selenide (CIGS) or cadmium telluride (CdTe) thin film solar cell.

Figure 3:
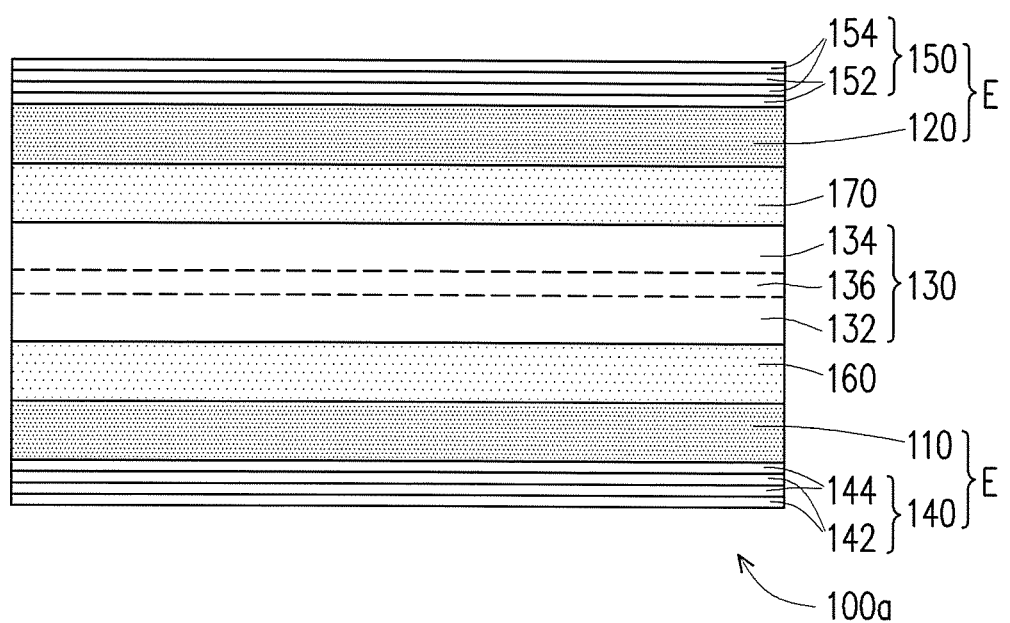
FIG. 3 is a cross-sectional diagram illustrating a solar cell according to a third embodiment.

FIG. 3 is a cross-sectional diagram illustrating a solar cell according to a third embodiment.

Referring to FIG. 3, the elements in a solar cell 100a are similar as those in FIGS. 1A and 1B and are labelled with the same reference numbers as in FIG. 1B. The main difference is that for the embodiment shown in FIG. 3, the solar cell 100a further includes a first passivation layer 160, disposed between the first electrode 110 and the photoelectric conversion layer 130; and a second passivation layer 170, disposed between the second electrode 120 and the photoelectric conversion layer 130.

In one embodiment, the material of the first passivation layer comprises silicon oxide ($SiO_2$), silicon nitride ($SiN_x$, x>0) and the material of the second passivation layer comprises aluminium oxide ($Al_2O_3$).

Figure 4A:
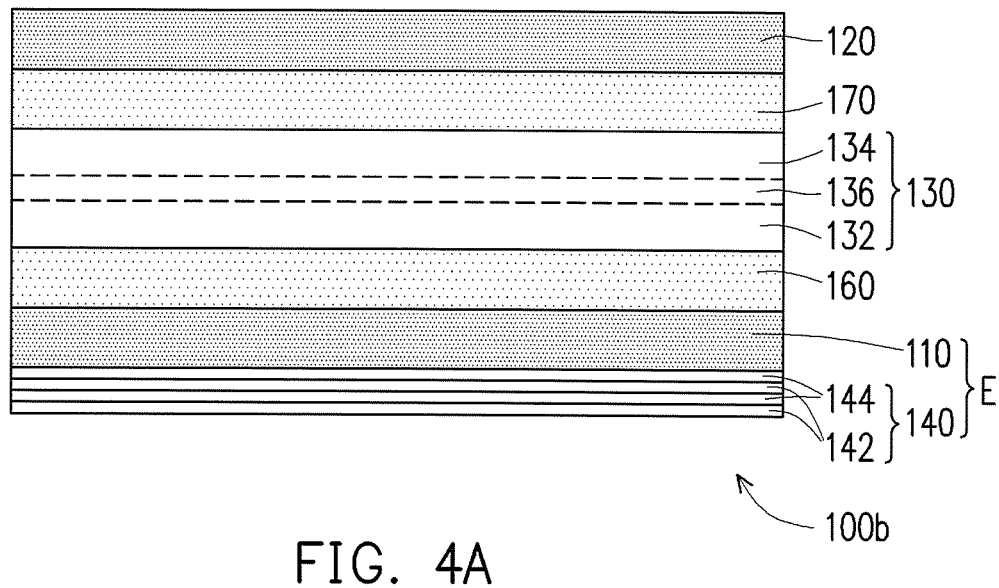
FIGS. 4A and 4B are a cross-sectional diagram illustrating a solar cell according to a fourth embodiment.
Figure 4B:
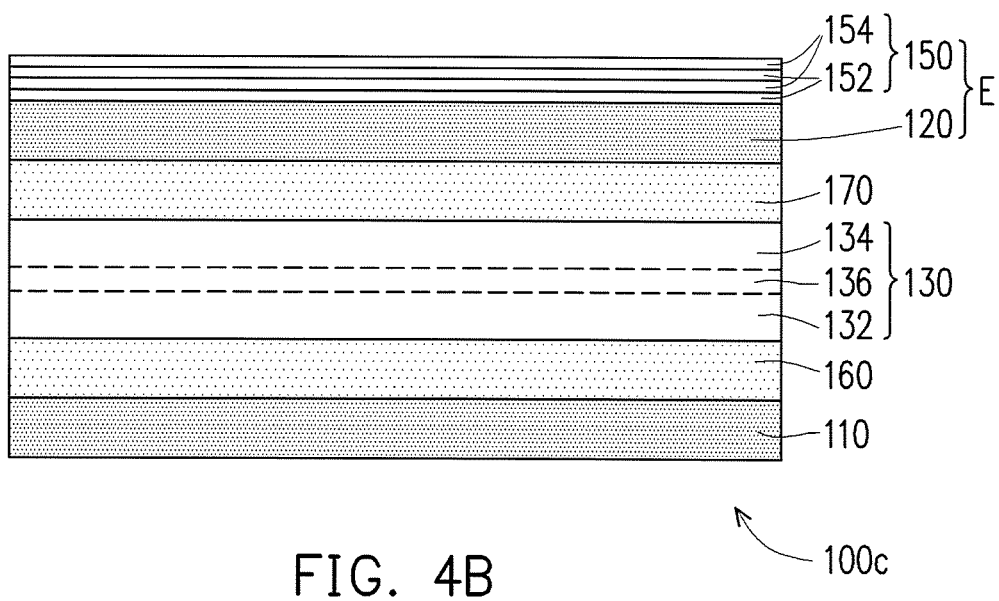

FIG. 4A, 4B are a cross-sectional diagram illustrating a solar cell according to a fourth embodiment.

Referring to FIGS. 4A and 4B, the elements in the solar cell 100b, 100c, are similar as those in FIG. 3 and labelled with the same reference numbers as in FIG. 3. The main difference is that for the embodiment shown in FIG. 4A, the electrical modulating stack layer 140 of the solar cell 100b is only disposed on the first electrode 110. In one embodiment in FIG. 4B, the electrical modulating stack layer 150 of the solar cell 100c, is only disposed on the second electrode 120. Therefore, the electrical modulating stack layer may only be disposed on one of the electrodes or on both of the first electrode and the second electrode simultaneously.

Experiment and Testing

In the first embodiment, the solar cell 100, the positive charged layer 142 and the negatively charged layer 144 of the first electrical modulating stack layer 140 and the positively charged layer 152 and the negatively charged layer 154 of the first electrical modulating stack layer 150 are formed by, for example, layer-by-layer self-assembly process. The material of the positively charged layer comprises poly dimethyl diallyl ammonium chloride, poly(allylamine hydrochloride), polyethylenimine, and the material of the negatively charged layer comprises poly(sodium-p-styrenesulfonate), poly(acrylic acid) or poly(perfluorosulfonic acid).

A copper indium gallium selenide (CIGS) solar cell is taken as an example, the CIGS solar cell with exposed negatively charged electrode, for example, ZnO, is immersed in a solution containing poly dimethyl diallyl ammonium chloride (PDDA), and the positively charged PDDA thin film is formed on the surface of the ZnO by self-assembly process. The ZnO electrode coated with PDDA thin film is then immersed in negatively charged poly(sodium-p-styrenesulfonate) (PSS) solution to obtained PSS thin film. By repeating the steps of absorbing one positively charged layer and one negatively charged layer alternately, the first electrical modulating stack layer 140 of the first electrode 110 and the second electrical modulating stack layer 150 of the second electrode 120 are obtained.

The electric double layer (142 and 144) of the electrical modulating stack layer can induce charge distribution on the surface of the first electrode 110. The mechanism of electrostatic interaction of positively charged layer (142,152) and negatively charged layer (144,154) on the first electrode 110 and the second electrode 120 are investigated by zeta potential measurement. Here, ZnO nanoparticle represent the ZnO electrode of a solar cell. When an electrically neutral ZnO nanoparticle is immersed in a positively charged polymer solution, for example, poly dimethyl diallyl ammonium chloride (PDDA), the average Zeta potential of the surface of the ZnO nanoparticle becomes +45 mV. The surface of the ZnO nanoparticle dramatically changed to positive value, owing to the adsorption of PDDA on the surface of ZnO nanoparticle.

In contrast, when the ZnO nanoparticle is immersed in a negative charged polymer solution, for example, poly(sodium-p-styrenesulfonate) (PSS), the surface of the ZnO nanoparticle dramatically changed to negative value, owing to the adsorption of PSS at the surface of ZnO nanoparticle.

Figure 5:
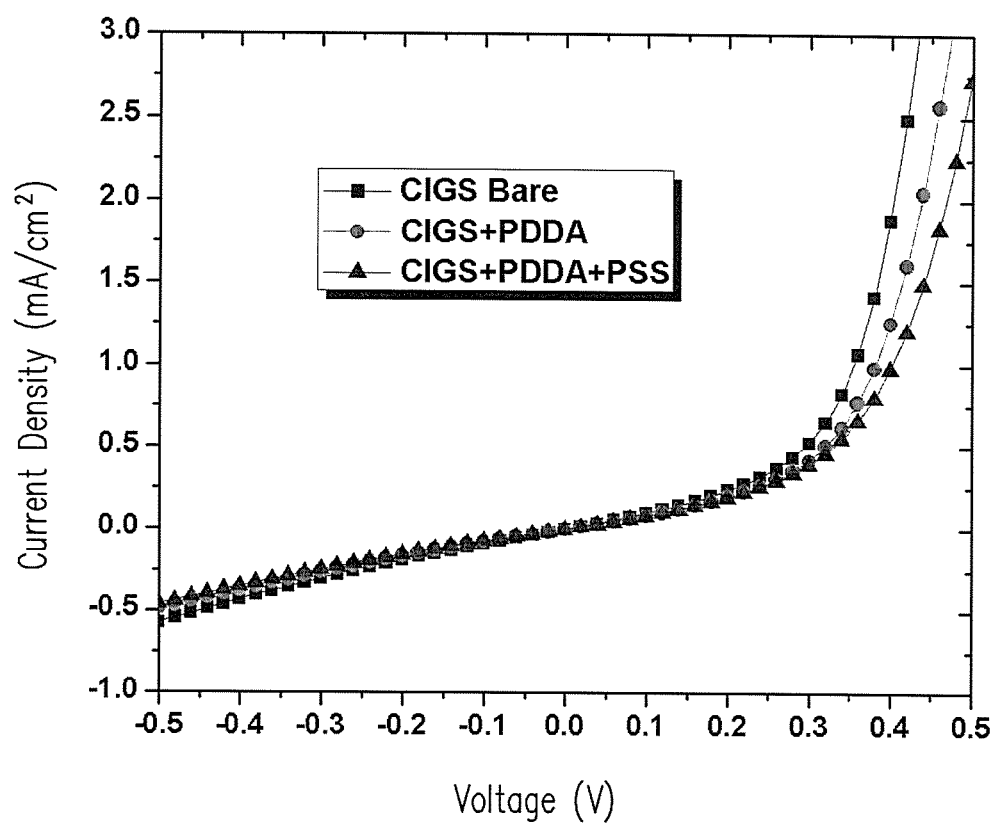
FIG. 5 is a dark I-V curve of a solar cell according to a first embodiment.

FIG. 5 is a dark I-V curve of a solar cell according to a first embodiment. Referring to FIG. 5, the dark current measured under a reverse bias of −0.5 V shows a 17.5% reduction in dark current after a positively charged layer PDDA and a negatively charged layer PSS are successively absorbed on surface of the CIGS solar cell. The dark current is mainly due to the recombination loss of minority carriers. CIGS solar cell with electrical modulating stack layer has lower dark current, which indicates the improvement of recombination loss within the solar cell after absorbing electrical modulating stack layer.

The most commonly used measurement method for the analysis of solar cell is I-V curve test which clearly shows the open circuit voltage (Voc), short circuit current (Isc), maximum power (Pmax), conversion efficiency ($\eta$ %), fill factor (FF %) of the solar cell. Thus, the embodiment employs I-V curve test to analyze the electrical properties of the first modulation stack 140 and the second modulation stack 150 on the solar cell, and all of these I-V tests are performed under 1 sun illumination at controlled temperature.

Figure 6:
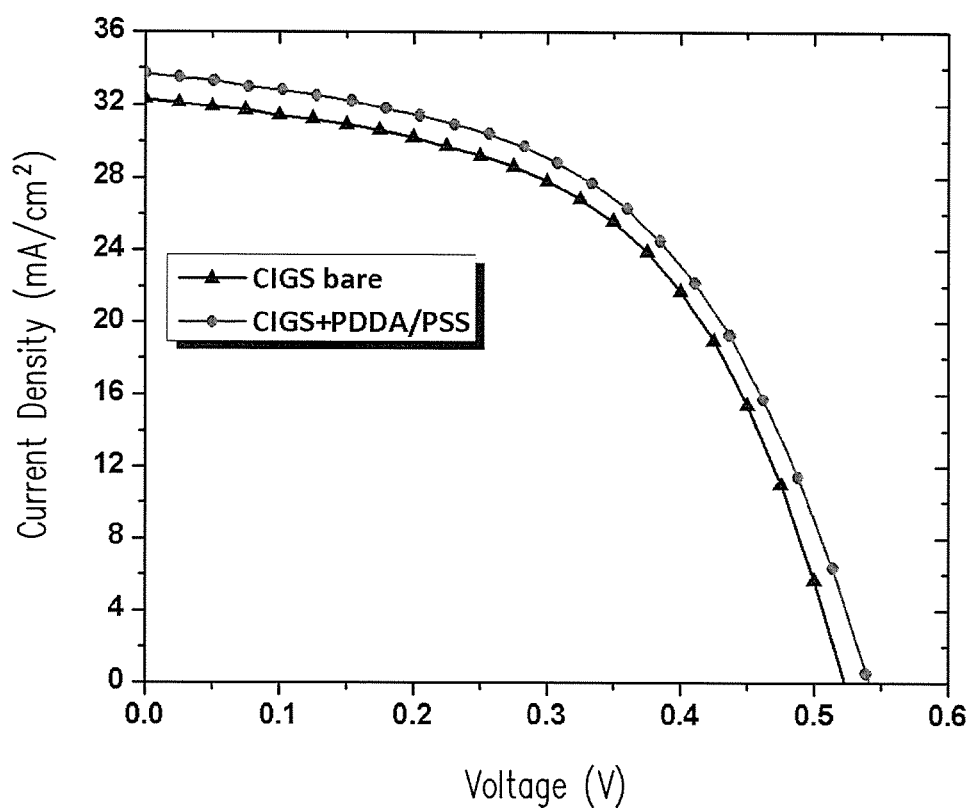
FIG. 6 is an I-V curve of a solar cell according to a first embodiment.

FIG. 6 is an I-V curve of a solar cell according to the first embodiment. Referring to FIG. 6, the I-V test results show that parameters such as open circuit voltage ($V_{oc}$), short circuit current ($J_{sc}$) and efficiency ($\eta$ %) of the CIGS solar cell are improved after absorbing the electrical modulating stack layer. The short circuit current ($J_{sc}$) is relatively increased by 4.0% from 32.3 mA/cm$^2$ to 33.6 mA/cm$^2$. The open circuit voltage ($V_{oc}$) is relatively increased by 4.2% from 520 mV to 542 mV. The efficiency ($\eta$ %) is relatively increased by 5.7% from 11.6% to 12.3%.

Figure 7:
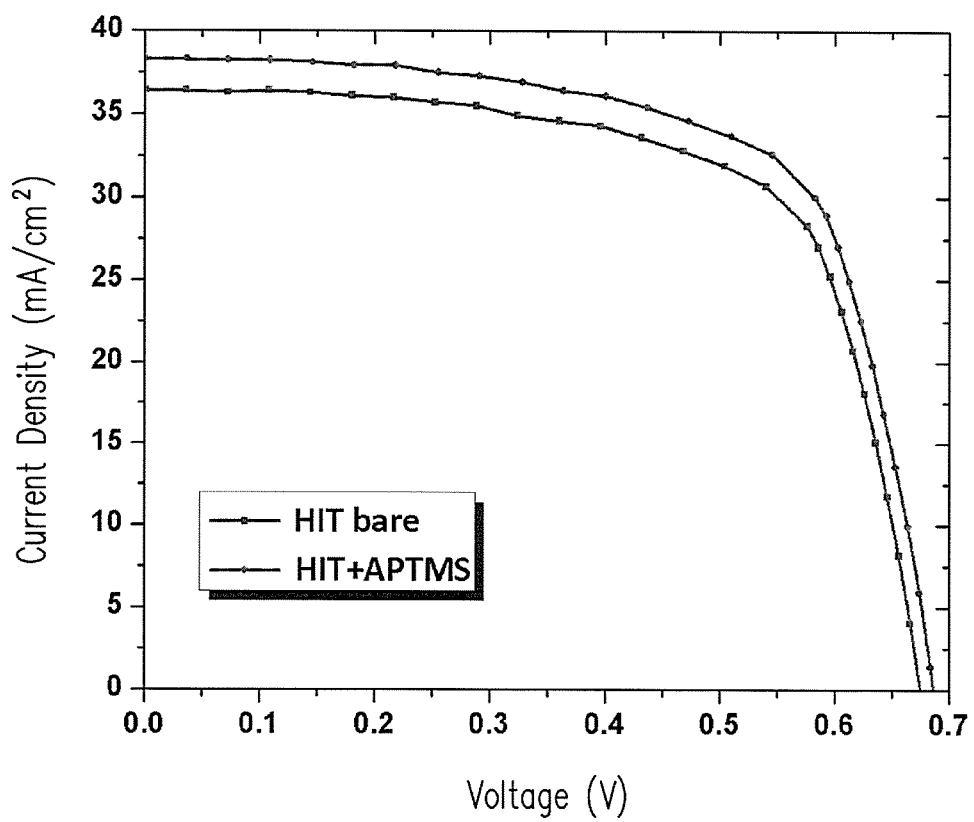
FIG. 7 is an I-V curve of a solar cell according to a second embodiment.

FIG. 7 is an I-V curve of a solar cell according to the second embodiment. Referring to FIG. 7, the I-V test results show that parameters such as open circuit voltage ($V_{oc}$), short circuit current ($J_{sc}$) and efficiency ($\eta$ %) of the HIT (heterojunction with intrinsic thin layer) solar cell are improved after having the surface modification layer with self-assembly process thereon. The short circuit current ($J_{sc}$) is relatively increased by 5.0% from 36.2 mA/cm$^2$ to 38.0 mA/cm$^2$. The open circuit voltage ($V_{oc}$) is relatively increased by 2.4% from 678 mV to 694 mV. The efficiency ($\eta$ %) is relatively increased by 5.3% from 20.9% to 22.0%.

In summary, in the embodiments of the disclosure, a charged material is directly deposited on the electrode of a solar cell through self-assembly process. The accumulated charges within the electrical modulation stack layer cause energy band bending, so as to effectively create passivation on the solar cell. In addition, as compared to the well-known vacuum semiconductor process, the technique of the disclosure is cheaper and easier for production without causing serious environmental problems.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell, comprising:
   a first electrode;
   a second electrode;
   a photoelectric conversion layer, disposed between the first electrode and the second electrode; and
   a first electrical modulating stack layer, disposed on the first electrode, wherein the first electrical modulating stack layer includes at least one positively charged layer and at least one negatively charged layer stacked alternately, and the first electrode is disposed between the first electrical modulating stack layer and the photoelectric conversion layer,
   wherein the positively charged layer and the negatively charged layer of the first electrical modulating stack layer are separately deposited layers.

2. The solar cell of claim 1, further including a second electrical modulating stack layer disposed on the second electrode, wherein the second electrical modulating stack layer includes at least one positively charged layer and at least one negatively charged layer, and the second electrode is disposed between the second electrical modulating stack layer and the photoelectric conversion layer.

3. The solar cell of claim 2, wherein the second electrical modulating stack layer and the first electrical modulating stack layer cannot contact each other.

4. The solar cell of claim 1, wherein the photoelectric conversion layer comprises a semiconductor base region, a semiconductor emitter region and a depletion region disposed between the semiconductor base region and the semiconductor emitter region.

5. The solar cell of claim 4, wherein the base region is disposed between the depletion region and the first electrode, and the emitter region is disposed between the depletion region and the second electrode.

6. The solar cell of claim 5, wherein the negatively charged layer of the first electrical modulating stack layer is directly disposed on the first electrode.

7. The solar cell of claim 5, further comprising a second electrical modulating stack layer disposed on the second electrode, wherein the second electrical modulating stack layer includes at least one positively charged layer and at least one negatively charged layer.

8. The solar cell of claim 7, wherein the positively charged layer of the second electrical modulating stack layer is directly disposed on the second electrode.

9. The solar cell of claim 1, wherein the second electrode comprises transparent conductive oxide or metal grid electrode.

10. The solar cell of claim 1, wherein the first electrode comprises a transparent conductive oxide, a metal layer, or a laminate layer having a transparent conductive layer and a metal layer.

11. The solar cell of claim 1, wherein the material of the positively charged layer comprises poly dimethyl diallyl ammonium chloride, poly(allylamine hydrochloride) or polyethylenimine.

12. The solar cell of claim 1, wherein the material of the negatively charged layer comprises poly(sodium-p-styrenesulfonate), poly(acrylic acid) or poly(perfluorosulfonic acid).

13. The solar cell of claim 1, wherein the solar cell comprises crystalline silicon solar cell, amorphous silicon thin film solar cell, amorphous and microcrystalline silicon thin film solar cell, copper indium gallium selenide (CIGS) or cadmium telluride (CdTe) thin film solar cell.

14. The solar cell of claim 1, further including
a first passivation layer, disposed between the first electrode and the photoelectric conversion layer; and
a second passivation layer, disposed between the second electrode and the photoelectric conversion layer.

15. A solar cell, comprising:
a first electrode;
a second electrode;
a photoelectric conversion layer, disposed between the first electrode and the second electrode; and
a first electrical modulating stack layer, directly disposed on the first electrode, wherein the first electrical modulating stack layer includes a first surface modification layer with separated multi deposited layers, wherein the first surface modification layer comprises (3-Aminopropyl) trimethoxysilane, (3-Aminopropyl)triethoxysilane, (3-Mercaptopropyl)trimethoxysilane, trimethoxysilane, (3-Glycidyloxypropyl)trimethoxysilane, hydroquinone or alkanethiol.

16. The solar cell of claim 15, further including a second electrical modulating stack layer disposed on the second electrode, wherein the second electrical modulating stack layer includes a surface modification layer, the second electrical modulating stack layer and the first electrical modulating stack layer cannot contact each other.

17. The solar cell of claim 15, wherein the solar cell comprises crystalline silicon solar cell, amorphous silicon thin film solar cell, amorphous and microcrystalline silicon thin film solar cell, copper indium gallium selenide (CIGS) or cadmium telluride (CdTe) thin film solar cell.

18. The solar cell of claim 15, further including
a first passivation layer, disposed between the first electrode and the photoelectric conversion layer; and
a second passivation layer, disposed between the second electrode and the photoelectric conversion layer.

19. The solar cell of claim 15, wherein the first electrode is disposed between the first electrical modulating stack layer and the photoelectric conversion layer.

* * * * *